United States Patent
Chen et al.

(10) Patent No.: US 9,575,674 B2
(45) Date of Patent: *Feb. 21, 2017

(54) DATA STREAMING FOR SOLID-STATE BULK STORAGE DEVICES

(71) Applicant: MICRON TECHNOLOGY, INC., Boise, ID (US)

(72) Inventors: Frank Chen, North Potomac, MD (US); Yuan Rong, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 104 days.

This patent is subject to a terminal disclaimer.

(21) Appl. No.: 14/589,382

(22) Filed: Jan. 5, 2015

(65) Prior Publication Data

US 2015/0113357 A1 Apr. 23, 2015

Related U.S. Application Data

(63) Continuation of application No. 12/327,879, filed on Dec. 4, 2008, now Pat. No. 8,930,645.

(30) Foreign Application Priority Data

Sep. 26, 2008 (CN) .................................. 0810211463

(51) Int. Cl.
G06F 3/06 (2006.01)
G06F 12/02 (2006.01)
G06F 11/10 (2006.01)

(52) U.S. Cl.
CPC ........... *G06F 3/0619* (2013.01); *G06F 3/0613* (2013.01); *G06F 3/0631* (2013.01); *G06F 3/0656* (2013.01); *G06F 3/0659* (2013.01); *G06F 3/0688* (2013.01); *G06F 11/1016* (2013.01); *G06F 11/1044* (2013.01); *G06F 12/0246* (2013.01); *G06F 2212/7203* (2013.01); *G06F 2212/7207* (2013.01)

(58) Field of Classification Search
CPC .. G06F 3/0619; G06F 11/1044; G06F 3/0631; G06F 11/1016; G06F 3/0656; G06F 3/0613; G06F 3/0688; G06F 3/0659; G06F 12/0246; G06F 2212/7207; G06F 2212/7203
See application file for complete search history.

(56) References Cited

U.S. PATENT DOCUMENTS

| | | |
|---|---|---|
| 5,928,339 A | 7/1999 | Nishikawa |
| 5,996,054 A | 11/1999 | Ledain et al. |
| 6,021,464 A | 2/2000 | Yao et al. |
| 6,378,035 B1 | 4/2002 | Parry et al. |
| 7,127,465 B2 | 10/2006 | Rao et al. |
| 8,386,630 B1 | 2/2013 | Atzmon |
| 2003/0048659 A1 | 3/2003 | Kanamori et al. |
| 2005/0185493 A1 | 8/2005 | Fujioka et al. |
| 2006/0031628 A1 | 2/2006 | Sharma |
| 2006/0059326 A1 | 3/2006 | Aasheim et al. |
| 2007/0016753 A1 | 1/2007 | Winter |

(Continued)

*Primary Examiner* — Arpan P. Savla
(74) *Attorney, Agent, or Firm* — Dicke, Billig & Czaja, PLLC

(57) ABSTRACT

Methods facilitate data streaming in bulk storage devices by generating linked lists containing entries for both user data and metadata. These linked lists containing mixed data types facilitate receiving and outputting user data, and to insert or ignore, respectively, metadata corresponding to that user data without interrupting flow of the user data.

20 Claims, 6 Drawing Sheets

(56) References Cited

U.S. PATENT DOCUMENTS

2007/0033376 A1    2/2007   Sinclair et al.
2008/0005499 A1    1/2008   McDonnell et al.
2008/0141043 A1    6/2008   Flynn et al.
2008/0162782 A1    7/2008   Suresh et al.
2008/0209125 A1    8/2008   Chen et al.
2008/0244152 A1   10/2008   Chai et al.
2008/0270744 A1   10/2008   Hashimoto
2009/0125726 A1    5/2009   Iyer et al.
2009/0171888 A1    7/2009   Anglin

DATA STREAMING FOR SOLID-STATE BULK STORAGE DEVICES

RELATED APPLICATIONS

This application is a continuation application of U.S. application Ser. No. 12/327,879, titled, "DATA STREAMING FOR SOLID-STATE BULK STORAGE DEVICES," filed Dec. 4, 2008, now U.S. Pat. No. 8,930,645 issued on Jan. 6, 2015, which is commonly assigned and incorporated herein in its entirety. This application further claims priority to Chinese Patent Application Serial No. 0810211463.7 filed Sep. 26, 2008, entitled "DATA STREAMING FOR SOLID-STATE BULK STORAGE DEVICES," which is commonly assigned.

TECHNICAL FIELD

The present disclosure relates generally to semiconductor memory, and in particular, in one or more embodiments, the present disclosure relates to methods and apparatus providing control of data streaming for solid-state bulk storage devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but often include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes (e.g., floating gates or trapping layers) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost for equivalent storage capacities.

In the efficient movement of data between data storage devices and data producer/consumer devices of an electronic system, direct memory access (DMA) has been developed to permit direct access to the storage device while allowing the primary processor of the electronic system to tend to other tasks. In such systems, data is often transferred to or from the storage devices in packets of defined size. These packets when received by a bulk storage device are often stored in volatile storage using a linked-list protocol. This facilitates efficient data transfer without waiting for data to be written to a non-volatile storage area of the bulk storage device.

Flash memory devices generally utilize some non-user data, often referred to as metadata, stored along with the user data. As an example, status indicators, error correction code data, mapping information and the like, generated by the bulk storage device, might be stored along with the user data. Storing these two data types together results in streaming a defined unit of user data to a memory device, and then interrupting the streaming of user data to fill subsequent write latches with the metadata. Once the metadata is written to the memory device, another defined unit of user data may be streamed. This periodic interruption of user data can lead to inefficiencies as the bulk storage device manages the traffic between the different data types to its non-volatile storage areas.

For the reasons stated above, and for other reasons which will become apparent to those skilled in the art upon reading and understanding the present specification, there is a need in the art for alternative control of data streaming for bulk storage devices.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
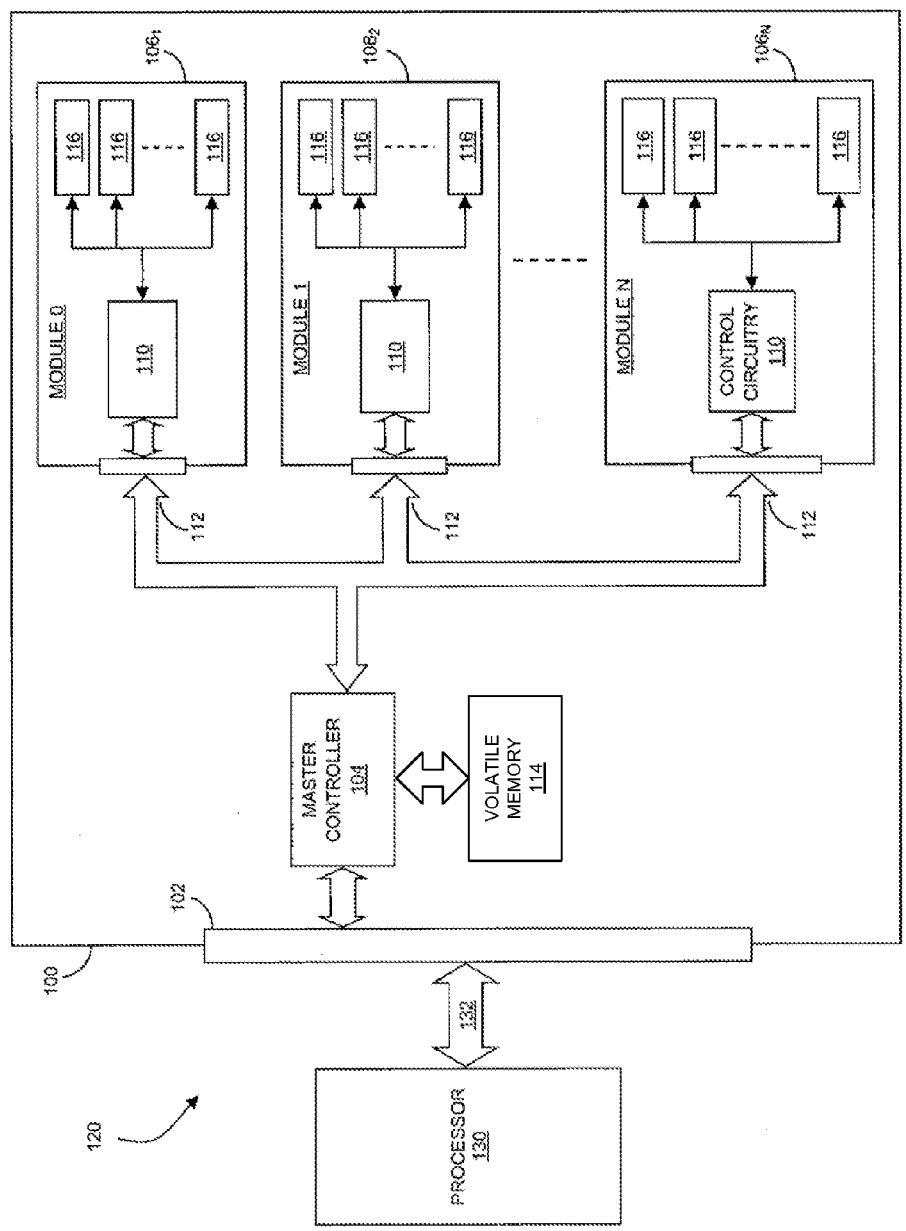
FIG. 1 is a functional block diagram of an electronic system having at least one memory module according to an embodiment of the disclosure.

FIG. 1 is a block diagram of a solid state drive (SSD) 100, i.e., a bulk storage device, in communication with (e.g., coupled to) a processor 130 as part of an electronic system 120, according to one embodiment of the disclosure. The electronic system 120 may be considered a host of the SSD 100 in that it controls the operation of the SSD 100 through its processor 130. Some examples of electronic systems include personal computers, laptop computers, personal digital assistants (PDAs), digital cameras, digital media players, digital recorders, electronic games and the like. The processor 130 may be a disk drive controller or other external processor. Typically there exists a communication bus 132 employing a standard protocol that is used to connect the processor 130 and the SSD 100. The communication bus 132 typically consists of multiple signals including address, data, power and various I/O signals. The type of communication bus 132 will depend on the type of drive interface being utilized in the system 120. Examples of some conventional disk drive interface bus protocols are IDE, ATA, SATA, PATA, Fibre Channel and SCSI. Other drive interfaces exist and are known in the art. It should be noted that FIG. 1 has been simplified to focus on the embodiments of the disclosure. Additional or different components, connections and I/O signals could be implemented as are known in the art without departing from the scope of the disclosure. For example, the SSD 100 could include power conditioning/distribution circuitry, a dedicated controller for volatile memory 114, etc. However, such additional components are not necessary to an understanding of this disclosure.

The SSD 100 according to one embodiment of the disclosure, as illustrated in FIG. 1, includes an interface 102 to allow a processor 130, e.g., a drive controller, to interact with the SSD 100 over communication bus 132. The interface 102 may be one of many standardized connectors commonly known to those skilled in the art. Some examples of these interface 102 connectors are IDE, ATA, SATA and PCMCIA connectors. As various embodiments of the disclosure can be configured to emulate a variety of conventional type HDDs, other disk drive connectors may also be utilized at the interface 102.

The SSD 100 of FIG. 1 also includes a master controller 104, a number of memory modules 106$_1$-106$_N$, and a volatile memory 114. Some of the functions performed by the master controller 104 are to manage operations within the SSD 100 and communicate with devices external to the SSD 100 such as the processor 130 over the communication bus 132. Memory modules 106$_1$-106$_N$ act as the bulk storage media for the SSD 100. Volatile memory 114 acts as buffer storage for data transfers to and from the SSD 100.

The master controller 104 manages the various operations of the SSD 100. As discussed, an SSD may be used as a drop in replacement for a standard HDD and there exist many standardized HDDs which have standard interfaces and communication protocols. Thus, one of the many functions of the master controller 104 is to emulate the operation of one of these standardized HDD protocols. Another function of the master controller 104 is to manage the operation of the memory modules 106 installed in the SSD 100. The master controller 104 can be configured to communicate with the memory modules 106 using a variety of standard communication protocols. For example, in one embodiment of the disclosure, the master controller 104 interacts with the memory modules 106 using a SATA protocol. Other embodiments may utilize other communication protocols to communicate with the memory modules 106. The master controller 104 may also perform additional functions relating to the memory modules such as ECC checking Implementation of the master controller 104 may be accomplished by using hardware or a hardware/software combination. For example, the master controller 104 may be implemented in whole or in part by a state machine. The master controller 104 is further configured to perform one or more methods of the present disclosure.

Memory modules 106 are coupled to the master controller 104 using internal communication bus 112. Communication between the master controller 104 and the memory modules 106 may be implemented by utilizing a common bus 112 as shown, and/or discrete connections between the master controller 104 and each memory module 106.

Control circuitry 110 manages the operation of the non-volatile memory devices 116 on its corresponding memory module 106$_1$-106$_N$. Memory devices 116 may be flash memory devices. The control circuitry 110 may also act to translate the communication protocol utilized by the master controller 104 to communicate with the memory module 106$_1$-106$_N$. For example, in one embodiment of the disclosure, the master controller 104 may be utilizing an SATA protocol to interact with the memory modules 106$_1$-106$_N$. In such an embodiment, the control circuitry 110 is configured to emulate a SATA interface. The control circuitry 110 can also manage other memory functions such as security features to regulate access to data stored in the memory module and wear leveling.

As noted above, the insertion of data generated at a bulk storage device into streams of user data received from an external device can lead to inefficiencies as the streaming is interrupted while the insertion is carried out at the bulk storage device. Various embodiments address this issue by generating a linked list that contains entries for the two data types. The entries have a defined order. For example, the linked list might be defined to have three entries for user data followed by one entry for metadata. This facilitates streaming data having a defined data structure.

Linked-list protocols provide for efficient streaming of data by defining a size of a unit of data to transfer and a starting address for that unit of data. In this manner, data can be streamed beginning at a starting address and continuing through subsequent consecutive addresses until the defined size has been transferred. The next entry in the linked list then defines the size of the next unit of data and its starting address, and the process can be repeated.

In prior systems, as user data was received by a bulk storage device, it would be stored to volatile memory. A linked list would be generated defining the size of data units to be stored in the volatile memory and the starting addresses of where each of those data units would be stored. As the master controller would subsequently stream those data units to its non-volatile memory modules, it would poll for a number of units transferred and then interrupt data transfer to the memory module to begin transferring metadata after a particular number of units of user data had been transferred. After transferring the metadata was complete, the master controller would then refer back to the linked list to re-initiate streaming of user data according to the next entry of the linked list.

Various embodiments described herein insert linked list entries for metadata within the user data entries. A value is defined for the number of user data entries to be created before a metadata entry is inserted. For example, user data may be received by the SDD 100 in units of a particular size, such as one sector. Thus, each linked list entry for user data would define a size indicative of the received unit of user data and the starting address as selected by the master controller 104 for storage of that received unit in the volatile memory 114. Note that a sector is often taken to be 512 Bytes, although there is no requirement to define the data units by sector, or to use 512 Bytes as a sector size. To continue with this example, if it is desired to write user data to a memory device configured for 4 KB of user data and 80 Bytes of metadata per page, and to separate the page into two sections of user data of 2 KB each, with each section of user data followed by a section of metadata of 40 Bytes each, the value in this example would be selected to be four, such that four linked list entries would be created for the received user data, each having a defined size of 512 Bytes, followed by a linked list entry for the metadata defining a size of 40 Bytes.

The receipt of user data does not need to be interrupted for the insertion of the metadata entry, and the metadata corresponding to that entry does not have to be generated prior to creation of the linked list entry. Because the master controller 104 knows the size of the corresponding metadata unit, it merely reserves the storage areas in its volatile memory 114 defined by the metadata unit size and the starting address. As some metadata may require calculations based on the received user data, e.g., the generation of error correction code (ECC) data, it would interrupt data flow to require calculation of that data before the next user data could be received. By simply reserving a storage location for the data, and creating its linked-list entry as described, once the metadata is generated and stored, the user data and its corresponding metadata may be streamed to a memory module 106 without interruption, thus permitting the master controller 104 to utilize its processing resources for other tasks, such as wear leveling and signal processing.

While the foregoing example described an embodiment for receipt of user data for writing to a memory module, the concepts described herein are also applicable to reading user data from a memory module. Thus, the linked list would be created defining the size and locations of user data units and metadata units to be received from the memory modules. Data would then be streamed from a memory module and stored to the addresses as defined in the linked list. The user data would then be available for output on the communication bus 132.

Figure 2:
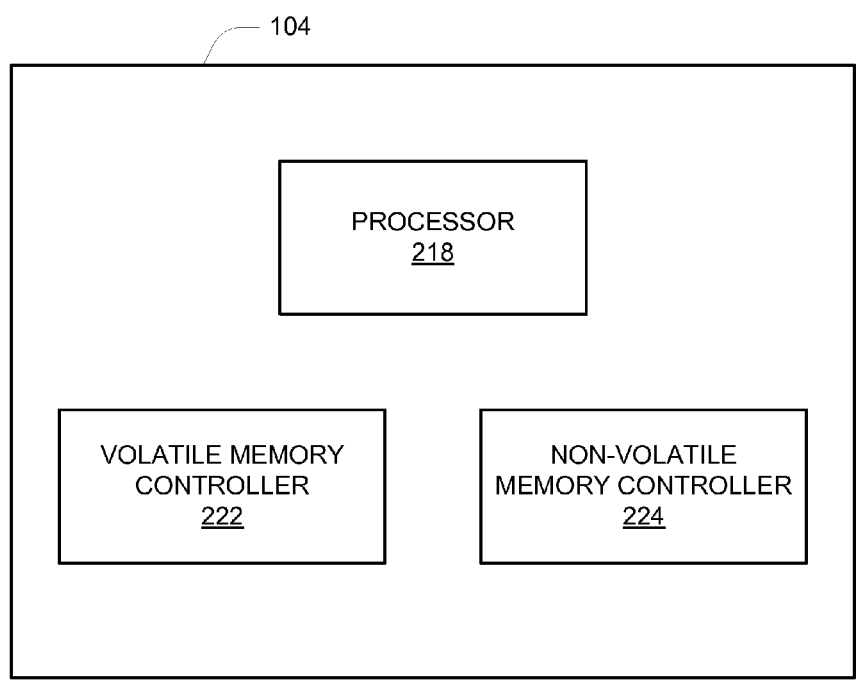
FIG. 2 is a block schematic showing additional detail of a master controller of FIG. 1 in accordance with an embodiment of the disclosure.

FIG. 2 is a block schematic showing additional detail of the master controller 104 of FIG. 1 in accordance with an embodiment of the disclosure. In FIG. 2, the master controller 104 includes a processor 218. The processor 218 provides for general operations of the SSD 100. For example, the processor 218 may perform signal processing to evaluate the signals received from the memory modules 106 and wear leveling to maintain relatively even usage of the various memory devices. The processor 218 may further decode commands received from an external device. For one embodiment, the processor 218 generates the linked lists as described herein.

The master controller 104 may further include a volatile memory controller 222 and a non-volatile memory controller 224 for control and access of the volatile memory 114 and non-volatile memory modules 106, respectively. In various embodiments, processor 218 may be configured to generate the linked lists, while the non-volatile memory controller 224 may be configured to stream data as defined by the linked lists to and from the memory modules 106 without further trafficking by the processor 218.

Figure 3:
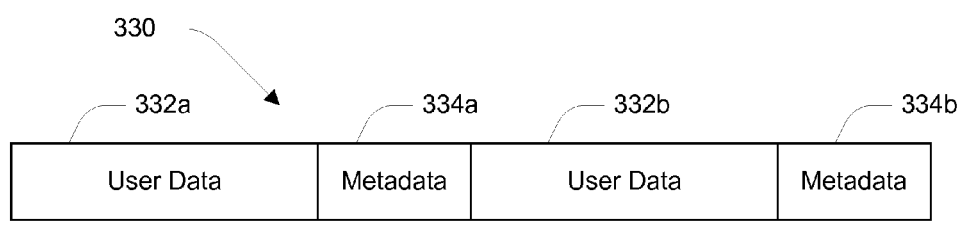
FIG. 3 is a representation of one embodiment of a data structure of a page in accordance with an embodiment of the disclosure.

FIG. 3 is a representation of one embodiment of a data structure of a page 330 in accordance with an embodiment of the disclosure. The page 330 has one or more user data portions 332 and one or more metadata portions 334. Metadata portions 334 contain data that is generally not received from an external device for storage on a memory device for subsequent retrieval by an external device. Examples include a logical address of the page 330, ECC data, status indicators, etc. As one example, each user data portion 332 contains 2,048 Bytes of user data and each metadata portion 334 contains 48 Bytes of metadata. A page 330 may further include additional data portions (not shown) for other purposes a designer might choose.

Because the external device providing user data to the SSD 100 during a write operation is generally not aware of the metadata, it would typically provide the user data to be programmed to a logical address, e.g., the address corresponding to the page 330, in one stream of data. As noted above, this stream of user data may contain one or more units of defined size, e.g., units of a sector of data. For various embodiments, in response to receiving a command to write user data to a logical address, the master controller 104 generates a linked list to define unit sizes and locations for storage of the user data. The master controller 104 further generates entries in the linked list to define unit sizes and locations for storage of metadata. The structure of the linked list would follow the desired data structure of the page 330. For example, where user data portions 332a and 332b are 2,048 Bytes each, metadata portions 334a and 334b are 48 Bytes each, user data units are 512 Bytes each and metadata units are 48 Bytes each, the linked list for a read or write of page 330 would contain four (2,048 Bytes/512 Bytes) user data entries, followed by one metadata entry, followed by four user data entries, followed by one metadata entry. Each user data entry would define a size of 512 Bytes and each metadata entry would define a size of 48 Bytes.

Figure 4A:
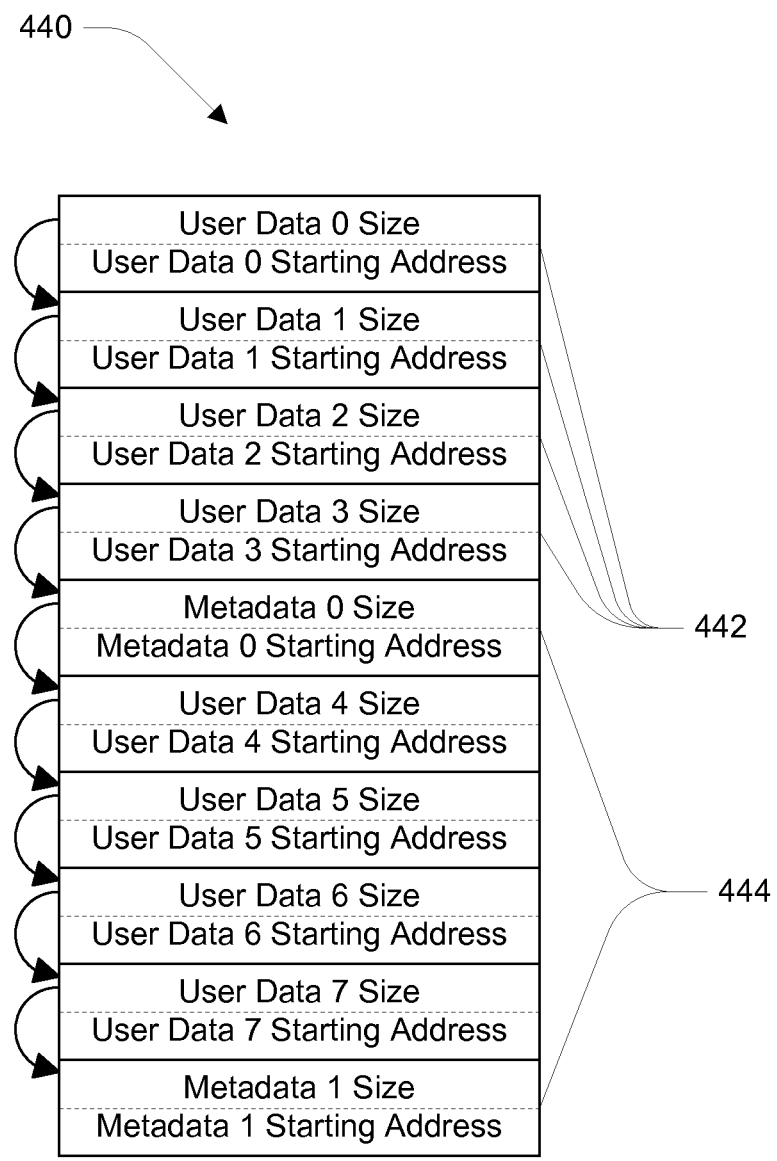
FIG. 4A is an representation of a linked list in accordance with an embodiment of the disclosure.

FIG. 4A is a representation of a linked list 440 in accordance with an embodiment of the disclosure. Linked list 440 includes one or more user data entries 442 and one or more metadata entries 444. The dashed line in each of the user data entries 442 and metadata entries 444 indicates that each entry defines both a size of the data unit for that entry and a starting address for that data unit.

Figure 4B:
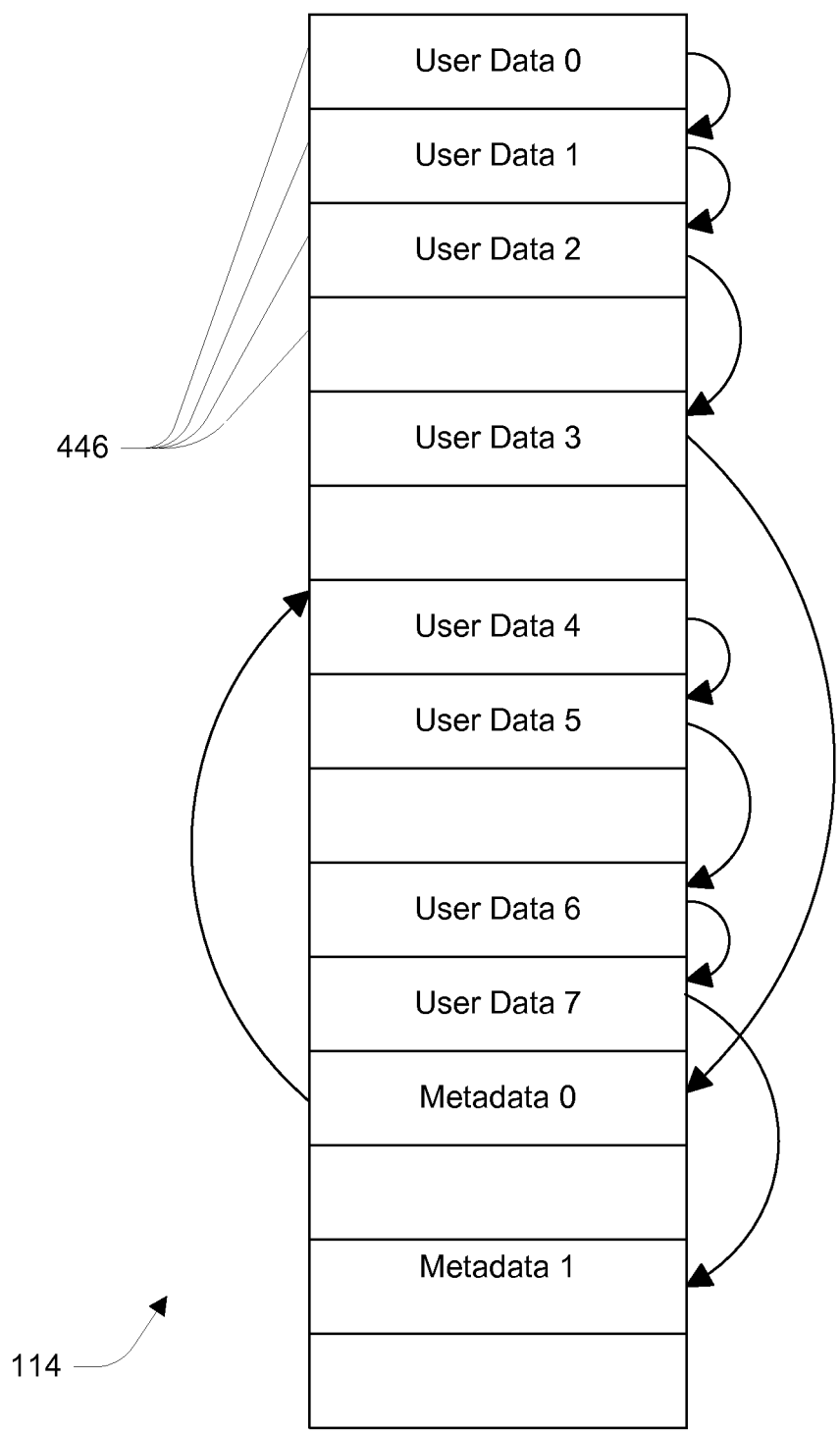
FIG. 4B is a representation of a portion of the volatile memory showing conceptually how various data units are stored and accessed in accordance with an embodiment of the disclosure.

FIG. 4B is a representation of a portion of the volatile memory 114 showing conceptually how the various data units are stored and accessed for transfer to a memory module. The volatile memory 114 has one or more sub-segments 446. Each sub-segment 446 represents contiguous address space within the volatile memory 114, although the individual sub-segments 446 need not have the same size. As user data units, e.g., user data 0-7 in FIG. 4B, are received by the SSD 100, each user data unit is stored in a sub-segment 446 as defined by the linked list 440. Note that although sub-segments 446 represent contiguous address space, individual user data units need not be stored to contiguous sub-segments 446. For example, there may be storage locations between where user data 2 ends and user data 3 begins. These storage locations may be unused, or they may already be designated for storage of other data used by processor 218.

Metadata units, e.g., metadata 0-1 in FIG. 4B, may be written to volatile memory 114 while user data units are being received or after that data transfer is complete. Metadata units are stored in a sub-segment 446 as defined by the linked list 440. As with user data, individual metadata units need not be stored to contiguous sub-segments 446. However the data of the metadata units is stored in consecutive address spaces of the individual sub-segments 446.

Entries for the linked list 440 are programmed prior to receiving data corresponding to those entries. However, the entire linked list 440 need not be created prior to completing a data transfer. For example, where a host device issues a write command to the SSD 100, the write command may be followed by 8 user data units. Thus, while a linked-list entry is created for a first user data unit before receiving the first user data unit, subsequent linked-list entries may be created while the first user data unit is being received. Also, linked-list entries for the metadata units are created before writing the metadata to the volatile memory 114 for subsequent streaming, but need not be created prior to generating the metadata.

Various embodiments may further control when metadata units are transferred to the volatile memory 114, or when they are transferred to the memory modules 106. For example, metadata should not be transferred to the volatile memory 114 until its corresponding linked-list entries are programmed with valid starting addresses. In addition, because some metadata may not be generated until after transfer of the user data is complete, streaming of such metadata to a memory module 106 should be delayed until after the sub-segment defined by the linked list contains valid metadata. Thus, the non-volatile memory controller 224 may be configured to prohibit storage of metadata to the volatile memory 114 streaming of metadata until its corresponding linked-list entry 444 has be generated, and to prohibit streaming of metadata from the volatile memory 114 until after the sub-segment 446 defined by the linked list contains valid metadata.

For transfer of user data units and metadata units to a memory module for non-volatile storage of the data, the non-volatile memory controller 224 then streams the data from the volatile memory according to the linked list 440. Thus, as depicted in FIG. 4B, user data 0 is provided to the memory module, followed by user data 1-3. Upon completion of the transfer of user data 3, metadata 0 is transferred, followed by user data 4-7, and then metadata 1. In this manner, user data and metadata are provided to the memory module having the defined data structure and without requiring interruption of the data streaming operation by the processor 218 for insertion of metadata. Because metadata is generally not provided to an external device, when responding to a read command of the SSD 100, data streaming from the volatile memory 114 to the communication bus 132 should skip the metadata entry 444 in the linked list 440.

Figure 5:
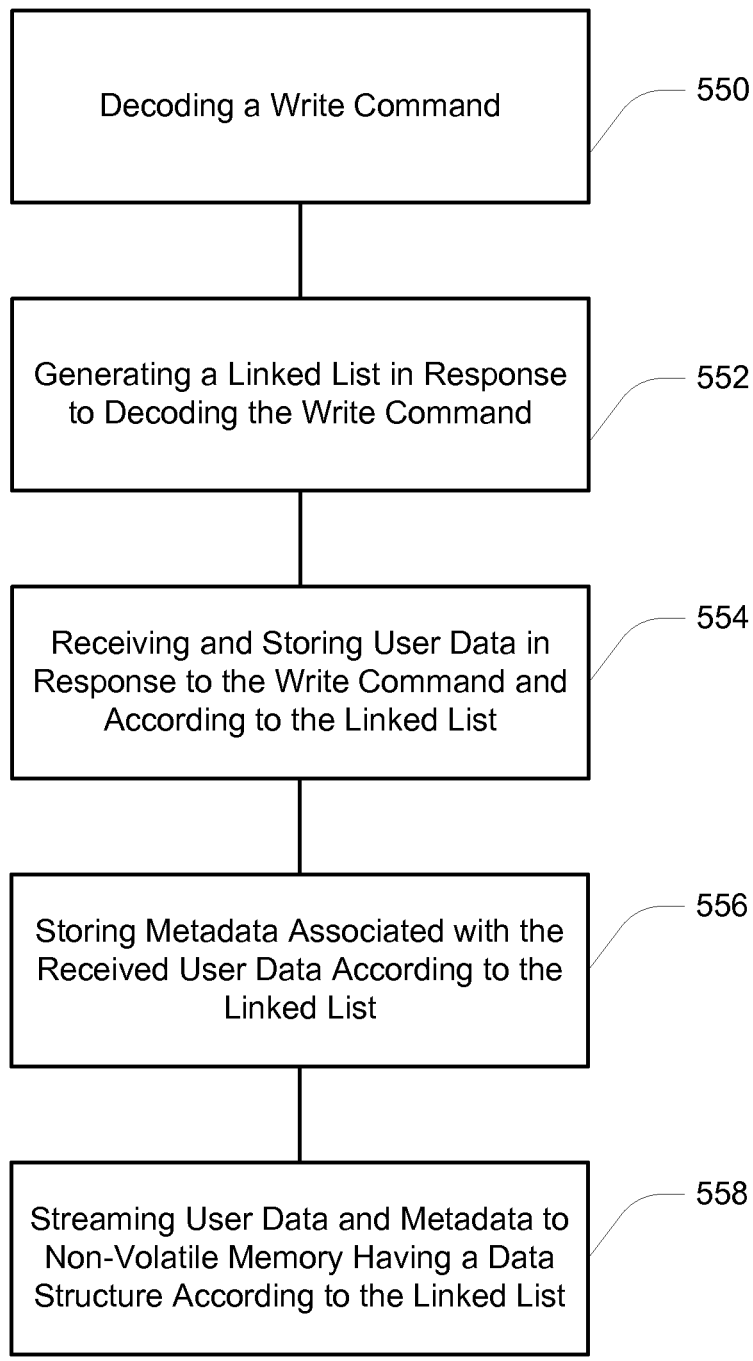
FIG. 5 is a flowchart of a method of writing data to a bulk storage device in accordance with an embodiment of the disclosure.

FIG. 5 is a flowchart of a method of writing data to a bulk storage device in accordance with an embodiment of the disclosure. At 550, a write command is decoded. The decoding may generally be performed by the processor of the master controller of the bulk storage device.

A write command is an externally-provided command that defines at least a logical address to where user data is to be written. The write command further provides the user data to be written to the bulk storage device. While the write command may define a user data unit size, this may be defined by protocol. Thus, a write command of a given protocol may define a number of user data units to follow the command and a size of each of the units without a need to explicitly provide that with the command.

At 552, in response to decoding the write command, the linked list is generated. The linked list will have a defined number of entries for user data, a defined number of entries for metadata, and a defined order of the entries. As noted above, each linked-list entry will define a unit size of the data to be stored and a starting address to where that unit of data is to be stored. The linked-list entries do not need to define what type of data is stored at their corresponding addresses. For example, the processor of the master controller of the bulk storage device can be configured such that it generates linked lists to store user data units at the addresses of a particular number of the entries before storing a metadata unit at the address of the next entry. The linked list should contain sufficient entries, i.e., a combination of a number of entries and a size for each entry, such that all user data associated with the write command has defined storage locations. The linked list will also contain at least one entry for metadata.

At 554, user data received in response to the write command is stored according to the addresses and unit sizes defined by the linked-list entries for user data. For example, a host might begin transferring user data units to the bulk storage device. As a first user data unit is received, data of the first user data unit is written to volatile memory beginning at a location defined by the starting address, and data of the first user data unit is then written to subsequent addresses of a contiguous memory space until the size defined by the linked-list entry is reached. The next user data unit received will then be stored to volatile memory according to the next linked-list entry for user data and so on until all of the user data associated with the write command has been received.

At 556, metadata generated by the bulk storage device associated with the received user data is stored according to the addresses and unit sizes defined by the linked-list entries for metadata. Although depicted in FIG. 5 to follow the receipt of the user data, some or all of the metadata may be stored according to its linked-list entries before all of the user data has been received. For example, the write command may be associated with eight user data units. For this example, the bulk storage device may receive the first four user data units, generate metadata for those user data units, and store that metadata to volatile memory before the last four user data units are received.

At 558, user data and metadata is streamed to non-volatile memory having a data structure defined by the linked list. For example, if the linked list has four user data entries of 512 Bytes each, one metadata entry of 48 Bytes, four user data entries of 512 Bytes each and one metadata entry of 48 Bytes, the structure of the data provided to the non-volatile memory would have 2,048 Bytes of user data, followed by 48 Bytes of metadata, followed by 2,048 Bytes of user data and followed by 48 Bytes of metadata.

Figure 6:
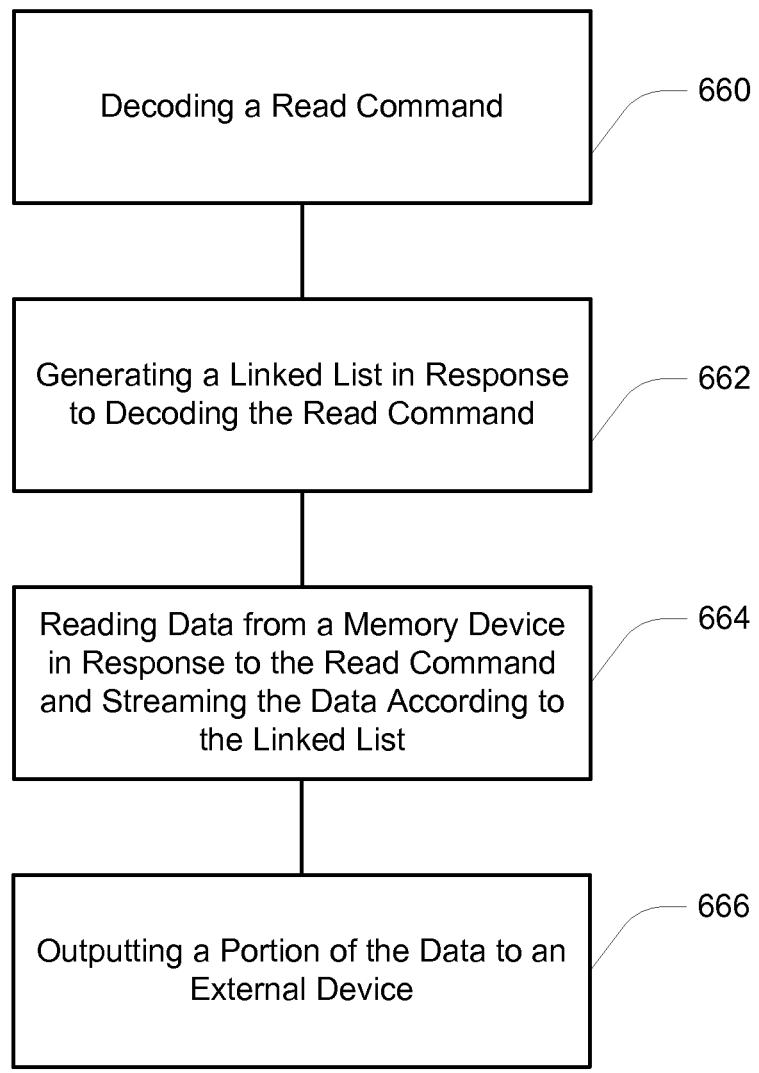
FIG. 6 is a flowchart of a method of reading data from a bulk storage device in accordance with an embodiment of the disclosure.

FIG. 6 is a flowchart of a method of reading data from a bulk storage device in accordance with an embodiment of the disclosure. At 660, a read command is decoded. The decoding may generally be performed by the processor of the master controller of the bulk storage device.

A read command is an externally-provided command that defines at least a logical address from where user data is to be retrieved. While the read command may define a user data unit size, this may be defined by the data structure of the memory device containing the data. Thus, a data structure of the memory device may define a number of user data units to retrieve and a size of each of the units without a need to explicitly provide that with the command.

At 662, in response to decoding the read command, the linked list is generated. The linked list will have a defined number of entries for user data, a defined number of entries for metadata, and a defined order of the entries. As noted above, each linked-list entry will define a unit size of the data to be stored and a starting address to where that unit of data is to be stored, whether that data is received from an external device or received from a memory module of the bulk storage device. The linked-list entries do not need to define what type of data is stored at their corresponding addresses. For example, the processor of the master controller of the bulk storage device can be configured such that it generates linked lists to store user data units at the addresses of a particular number of the entries before storing a metadata unit at the address of the next entry. The linked list should contain sufficient entries, i.e., a combination of a number of entries and a size for each entry, such that all data associated with the read command has defined storage locations. The linked list will also contain at least one entry for metadata.

At 664, data is read from a memory device of the bulk storage device in response to the read command and is streamed to volatile memory according to the addresses and unit sizes defined by the linked-list entries for that data. For example, a read command may result in a page of data being read from a memory device. This page of data is then written to volatile memory according to the linked-list entries. For example, if the linked list has four user data entries of 512 Bytes each, one metadata entry of 48 Bytes, four user data entries of 512 Bytes each and one metadata entry of 48 Bytes, the first 2,048 Bytes of data is stored according to the first four user data entries, the next 48 Bytes of data is stored according to the first metadata entry, the next 2,048 Bytes of data is stored according to the last four user data entries, and the next 48 Bytes of data is stored according to the last metadata entry. For one embodiment, the non-volatile memory controller is configured to stream data from a non-volatile memory device to the volatile memory controller without intervention by the processor of the master controller. In this manner, while data is being populated to the volatile memory according to the linked list, the processor is free to handle other tasks and does not need to be involved in the data transfer to volatile memory.

At 666, user data is output to an external device. Metadata is generally used internally by the bulk storage device and is not meant for use by external devices. Accordingly, the linked list can be used to transfer only the user data portions of the retrieved data by simply skipping the linked-list entries for metadata.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a storage device, comprising: generating a linked list in response to decoding an access command received at the storage device, wherein the linked list has two or more first entries corresponding to user data, two or more second entries corresponding to metadata, and a defined order of the first entries and the second entries corresponding to a defined data structure of a page of data of a first memory of the storage device, wherein each first entry of the linked list identifies a size of a respective portion of user data and a starting address for storage of that portion of user data to a second memory of the storage device, and wherein each second entry of the linked list identifies a size of a respective portion of metadata and a starting address for storage of that portion of metadata to the second memory of the storage device;

storing portions of user data and portions of metadata to the second memory according to the sizes and the starting addresses identified by the ordered entries of the linked list; and outputting at least the stored portions of user data from the second memory.

2. The method of claim 1, further comprising receiving the portions of user data from an external device and generating the portions of metadata by the storage device when the access command is a write command.

3. The method of claim 2, further comprising generating at least one of the portions of metadata prior to receiving all of the portions of user data.

4. The method of claim 3, further comprising generating at least one of the portions of metadata after receiving at least one of the portions of user data.

5. The method of claim 2, wherein generating the portions of metadata further comprises generating at least some metadata in response at least one of the portions of user data.

6. The method of claim 5, wherein generating at least some metadata in response at least one of the portions of user data comprises generating at least error correction code data for the at least one of the portions of user data.

7. The method of claim 6, wherein generating at least some metadata further comprises generating metadata comprising status indicators and/or mapping information.

8. The method of claim 1, further comprising reading user data and metadata from the page of data of the first memory prior to storing the portions of user data and the portions of metadata to the second memory.

9. The method of claim 1, wherein storing portions of user data and portions of metadata to the second memory comprises storing the portions of user data and the portions of metadata to non-contiguous sub-segments of the second memory.

10. The method of claim 1, wherein generating a linked list further comprises generating the linked list such that sizes identified for each first entry of the linked list are the same size and sizes identified for each second entry of the linked list are the same size.

11. The method of claim 10, wherein generating a linked list further comprises generating the linked list such that sizes identified for each first entry of the linked list are different than sizes identified for each second entry of the linked list.

12. The method of claim 1, wherein generating a linked list further comprises generating the linked list such that sizes identified for each entry of the linked list are defined by sizes of respective portions of data of the defined data structure of the page of data.

13. The method of claim 1, wherein generating a linked list further comprises generating the linked list such that the defined order of the first entries and the second entries comprises interleaving instances of the second entries with instances of the first entries.

14. The method of claim 1, wherein generating a linked list having a defined order of the first entries and the second entries corresponding to a defined data structure of a page of data of a first memory of the storage device comprises generating the linked list such that the order of the first entries and the second entries of the linked list matches an order of portions of user data and portions of metadata as would be stored to the page of data of the first memory.

15. The method of claim 1, further comprising:
when the access command is a read command:
storing portions of user data and portions of metadata to the second memory according to the sizes and the starting addresses identified by the ordered entries of the linked list comprises streaming data from the first memory to the second memory according to the sizes and the starting addresses identified by the ordered entries of the linked list; and
outputting at least the stored portions of user data from the second memory comprises outputting only the stored portions of user data from the second memory to an external device; and
when the access command is a write command:
storing portions of user data and portions of metadata to the second memory according to the sizes and starting addresses identified by the ordered entries of the linked list comprises storing portions of user data received from the external device and portions of metadata generated by the storage device to the second memory according to the sizes and starting addresses identified by the ordered entries of the linked list; and
outputting at least the stored portions of user data from the second memory comprises streaming the stored portions of user data and the stored portions of metadata from the second memory to the first memory in the defined order of the respective entries of the linked list such that the streamed data satisfies the defined data structure of the page of data of the first memory.

16. A method of operating a storage device, comprising:
generating a linked list in response to decoding a write command received at the storage device from an external device, wherein the linked list has two or more first entries corresponding to user data, two or more second entries corresponding to metadata, and a defined order of the first entries and the second entries corresponding to a defined data structure of a page of data of a first memory of the storage device, wherein each first entry of the linked list identifies a size of a respective portion of user data and a starting address for storage of that portion of user data to a second memory of the storage device, and wherein each second entry of the linked list identifies a size of a respective portion of metadata and a starting address for storage of that portion of metadata to the second memory of the storage device;
receiving user data from the external device associated with the write command;
storing portions of the user data received from the external device and portions of metadata generated by the storage device to the second memory according to the sizes and starting addresses identified by the ordered entries of the linked list; and
streaming the stored portions of user data and the stored portions of metadata from the second memory to the page of data of the first memory as identified by the write command in the defined order of the respective entries of the linked list such that the streamed data satisfies the defined data structure of the page of data of the first memory.

17. The method of claim 16, further comprising generating at least one of the portions of metadata after receiving at least one of the portions of user data.

18. The method of claim 17, further comprising generating at least one of the portions of metadata prior to receiving all of the portions of user data.

19. The method of claim 17, wherein generating at least one of the portions of metadata after receiving at least one of the portions of user data further comprises generating at least some metadata in response at least one of the received portions of user data.

20. A method of operating a storage device, comprising:
generating a linked list in response to decoding a read command received at the storage device from an external device, wherein the linked list has two or more first entries corresponding to user data, two or more second entries corresponding to metadata, and a defined order of the first entries and the second entries corresponding to a defined data structure of a page of data of a first memory of the storage device, wherein each first entry of the linked list identifies a size of a respective portion of user data and a starting address for storage of that portion of user data to a second memory of the storage device, and wherein each second entry of the linked list identifies a size of a respective portion of metadata and a starting address for storage of that portion of metadata to the second memory of the storage device;
reading user data and metadata from the page of data of the first memory device as identified by the read command;
streaming portions of the user data and portions of the metadata from the first memory to the second memory according to the sizes and the starting addresses identified by the ordered entries of the linked list; and
outputting only the stored portions of user data from the second memory to the external device in response to the read command.

* * * * *